US010104795B2

(12) United States Patent
Liebert et al.

(10) Patent No.: US 10,104,795 B2
(45) Date of Patent: Oct. 16, 2018

(54) PROTECTIVE ASSEMBLIES FOR ENCLOSURES

(71) Applicant: ILLINOIS TOOL WORKS INC., Glenview, IL (US)

(72) Inventors: Scott Stephen Liebert, Freedom, WI (US); Paul William Garvey, Freedom, WI (US)

(73) Assignee: Illinois Tool Works Inc., Glenview, IL (US)

( * ) Notice: Subject to any disclaimer, the term of this patent is extended or adjusted under 35 U.S.C. 154(b) by 0 days.

(21) Appl. No.: 15/355,871

(22) Filed: Nov. 18, 2016

(65) Prior Publication Data

US 2018/0146565 A1 May 24, 2018

(51) Int. Cl.

*H05K 7/02* (2006.01)
*H05K 7/04* (2006.01)
*H05K 5/06* (2006.01)
*H05K 7/18* (2006.01)
*H05K 5/03* (2006.01)
*H05K 5/04* (2006.01)

(52) U.S. Cl.

CPC ............... *H05K 5/061* (2013.01); *H05K 5/03* (2013.01); *H05K 7/18* (2013.01); *H05K 5/04* (2013.01)

(58) Field of Classification Search

CPC ............ H05K 5/061; H05K 5/03; H05K 5/04; H05K 7/18
USPC ......................... 361/728–730, 807, 809–810
See application file for complete search history.

(56) References Cited

U.S. PATENT DOCUMENTS 3,594,490 A 7/1971 Mitchell
4,278,139 A 7/1981 Caris
4,471,898 A * 9/1984 Parker ................. H05K 7/1418 220/23.4
4,786,122 A * 11/1988 Nichoalds ............. A47B 47/05 312/249.8
6,070,396 A 6/2000 Rinaldi
6,089,637 A 7/2000 Brunelle
(Continued)

FOREIGN PATENT DOCUMENTS

WO 2006086371 A2 8/2006
WO 2006086371 A3 8/2006

OTHER PUBLICATIONS

Luxebell Frame Mount Housing, posted at Amazon.com , posted on Jan. 6, 2015, site visited Nov. 16, 2017. online, Available from Internet: https://www.amazon.com/Luxebell-Frame-Housing-Protective-Standard/dp/BOOPBUYWOI.
(Continued)

*Primary Examiner* — Hung S Bui
(74) *Attorney, Agent, or Firm* — McAndrews, Held & Malloy, Ltd.

(57) ABSTRACT

Protective assemblies for enclosures are described. An example apparatus includes a chassis configured to hold one or more electronic systems, a first frame configured to engage a first side of the chassis, a second frame configured to engage a second side of the chassis opposite the first side, and members attached between the first frame and the second frame using fasteners, the members extending between the first frame and the second frame to rigidly secure the first frame and the second frame against the chassis to create an enclosure comprising the first frame, the second frame, and the chassis, the members being exterior to the chassis.

18 Claims, 13 Drawing Sheets

100 112b 116b 110b 108b 104 104 112d 116d 110a 116a 112a 110d 108d 108a 116c 112c 110c 120d 120a 114a 108c 102 114d 106 106 120c 114c

(56) References Cited

U.S. PATENT DOCUMENTS

| | | | | |
|---|---|---|---|---|
| 6,166,910 | A * | 12/2000 | Ronberg | E05B 73/0082 248/551 |
| 6,420,652 | B1 * | 7/2002 | Byczek | H05K 5/0073 174/152 R |
| 6,550,880 | B2 * | 4/2003 | Reuter | A47B 47/05 312/257.1 |
| 6,657,869 | B1 * | 12/2003 | Linke | B60R 21/01 257/99 |
| 7,078,619 | B2 * | 7/2006 | Chamberlain | G01V 1/16 174/37 |
| 7,242,574 | B2 * | 7/2007 | Sullivan | G06F 1/1601 361/679.21 |
| 7,370,840 | B1 * | 5/2008 | Deconinck | E05B 73/0082 248/316.1 |
| 8,169,777 | B2 * | 5/2012 | Huang | G06F 1/181 248/223.31 |
| D682,785 | S | 5/2013 | Liebert | |
| 8,841,582 | B2 | 9/2014 | Bender | |
| 8,844,951 | B2 | 9/2014 | De Jong | |
| 9,084,356 | B2 * | 7/2015 | Fife | H04M 1/11 |
| 9,149,892 | B2 | 10/2015 | Liebert | |
| 2008/0135695 | A1 | 6/2008 | Ertmer | |
| 2010/0084387 | A1 | 4/2010 | Bender | |
| 2011/0192823 | A1 | 8/2011 | Williams | |
| 2011/0204013 | A1 | 8/2011 | Lahti | |
| 2013/0146575 | A1 | 6/2013 | Hillen | |
| 2015/0021305 | A1 | 1/2015 | Rozmarynowski | |
| 2015/0129568 | A1 | 5/2015 | Miller | |
| 2015/0313028 | A1 | 10/2015 | Bell | |
| 2016/0095253 | A1 * | 3/2016 | Tufty | H05K 5/0008 361/699 |
| 2016/0129524 | A1 | 5/2016 | Evans | |
| 2017/0050258 | A1 | 2/2017 | Hillen | |
| 2017/0312845 | A1 | 11/2017 | Chantry | |

OTHER PUBLICATIONS

Int'l Search Report and Written Opinion for PCT/US2017/061900 dated Mar. 7, 2018 (12 pgs.).

* cited by examiner 116b
112b
106
112d
116d
108b
102
108d
100
120b
114b
104
114d
120d 116a
112a
104
112c
116c
108a
102
108c
100
120a
114a
106
114c
120c 102
104
106
108a
108b
108c
108d
112a
112b
112c
112d
114a
114b
114c
114d
116a
116b
116c
116d
120a
120b
120d 130
128
128
130
104
130
112a
118a

PROTECTIVE ASSEMBLIES FOR ENCLOSURES

BACKGROUND

The invention relates generally to protective equipment frames and, more specifically, to protective assemblies for enclosures.

Durability is an issue for the packaging of electronic equipment that is used in industrial environments. For example, equipment may be dropped and/or objects can fall onto the equipment. Protective cases can add cost and/or weight to conventional equipment. Electronic equipment can get dirty and/or overheat without adequate ventilation when resting on a surface during use, if the equipment is placed on the surface in an orientation different than what was intended by the designer of the equipment.

SUMMARY

Protective assemblies for enclosures are disclosed, substantially as illustrated by and described in connection with at least one of the figures, as set forth more completely in the claims.

BRIEF DESCRIPTION OF THE DRAWINGS

The figures are not necessarily to scale. Where appropriate, similar or identical reference numbers are used to refer to similar or identical components.

DETAILED DESCRIPTION

Example enclosures constructed of a molded, cast, machined, fabricated, forged, and/or additively manufactured frame are disclosed herein. The frame incorporates handles that clamp the frame together to contain a chassis an equipment enclosure. The enclosure chassis may be constructed of folded and/or extruded sheet metal that can be joined together at none, one, or multiple seams. The frame components also serve as a protective structure to protect user interface components and/or provide separation between the walls of the enclosure and a surface on which it rests.

In some examples, the frame supports accessories and/or attachments by utilizing screw bosses in the molded or cast frame parts.

Disclosed examples integrate a protective structure into the assembly, thereby reducing the weight and/or cost of the assembly by reducing or avoiding extraneous parts or material. Disclosed examples also support a top-down assembly and/or can be easily disassembled for service.

As used herein, the term "top-down assembly" refers to an ordered assembly of components, where the order is based on the location of the component in the assembly, starting at a designated "top" of the resulting assembly and moving toward a designated "bottom" of the resulting assembly. The designated "top" and the designated "bottom" of the assembly may be arbitrarily assigned or designated according to any desired criteria. As used herein to refer to components or elements in the figures, the terms "first" and "second" do not connote any particular order or arrangement. For instance, the terms "first" and "second" do not imply any particular assembly order.

Figure 1:
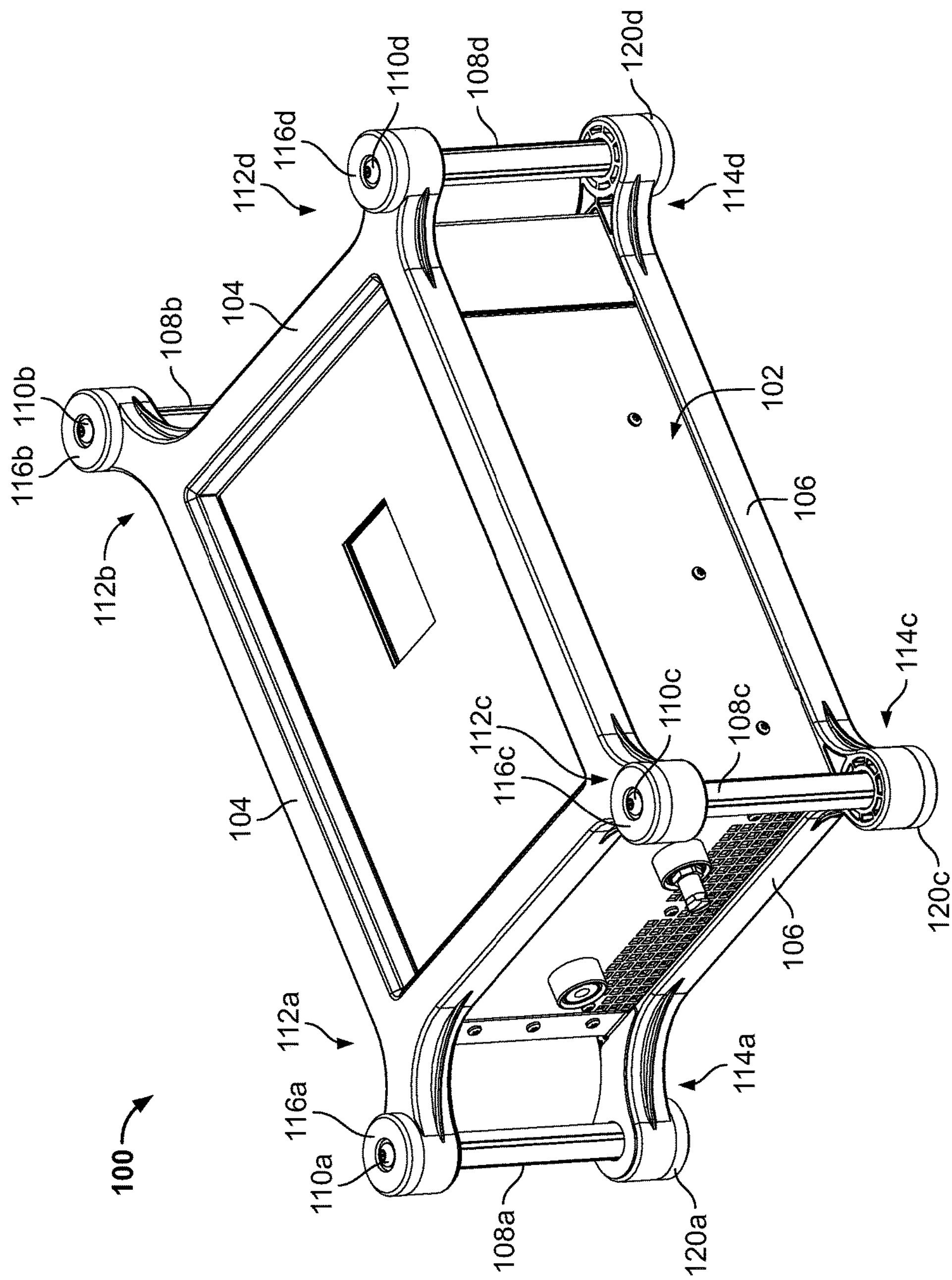
FIG. 1 illustrates an example assembly for a chassis containing electronic components, in accordance with aspects of this disclosure.

FIG. 1 illustrates an example assembly 100 for a chassis 102 containing electronic components. The chassis 102 is configured to hold one or more electronic systems, such as power electronics, cooling components, communication components, and/or any other type of electronic and/or non-electronic components. The chassis 102 may be used to house a welding-type power supply, a wire feeder, an inductive heating power supply, a plasma cutter, a space heater, a work radio, and/or any other type of electronic circuitry. In some examples, the chassis 102 in constructed of multiple panels, such as panels of folded and/or extruded sheet metal that are joined together at one or more seams.

The example assembly 100 of FIG. 1 protects the chassis 102 from impacts, enables easier handling (e.g., carrying) of the assembly 100 and the chassis 102, and provides separation between the chassis 102 and a surface on which the assembly 100 and the chassis 102 rest.

In the example of FIG. 1, the assembly 100 includes a first frame 104 configured to engage a first side of the chassis 102, and a second frame 106 configured to engage a second side of the chassis 102 opposite the first side. The assembly 100 also includes members 108*a*, 108*b*, 108*c*, 108*d* attached between the first frame 104 and the second frame 106 using fasteners 110*a*, 110*b*, 110*c*, 110*d*. The members 108*a*-108*d* extend between the first frame 104 and the second frame 106 to rigidly secure the first frame 104 and the second frame 106 against the chassis 102 to create an enclosure. In some examples, the first frame 104 and the second frame 106 have identical structure. The resulting enclosure includes the first frame 104, the second frame 106, and the chassis 102. In the example of FIG. 1, the members 108*a*-108*d* are exterior to the chassis 102. In some examples, the members 108*a*-108*d* may be considered as handles for carrying and/or handling the assembly 100. The members 108*a*-108*d* may be metal or plastic, and in the illustrated example are constructed with sufficient rigidity and strength to enable the weight of the assembly 100, the chassis 102, and/or any components within the chassis 102 to be carried by one or more of the members 108*a*-108*d*.

The first frame 104 includes first member extensions 112*a*, 112*b*, 112*c*, 112*d* projecting outward from the chassis 102. Similarly, the second frame 106 comprises second member extensions 114*a*, 114*b*, 114*c*, 114*d* projecting outward from the chassis 102 opposite respective ones of the first member extensions 112*a*, 112*b*, 112*c*, 112*d*. The members 108*a*-108*d* are detachably attached between the first member extensions 112*a*-112*d* and the second member extensions 114*a*-114*d*. In some other examples, all or portions of the members 108*a*-108*d* may be integral with corresponding ones of the first member extensions 112*a*, 112*b*, 112*c*, 112*d* and/or the second member extensions 114*a*, 114*b*, 114*c*, 114*d*.

Figure 2:
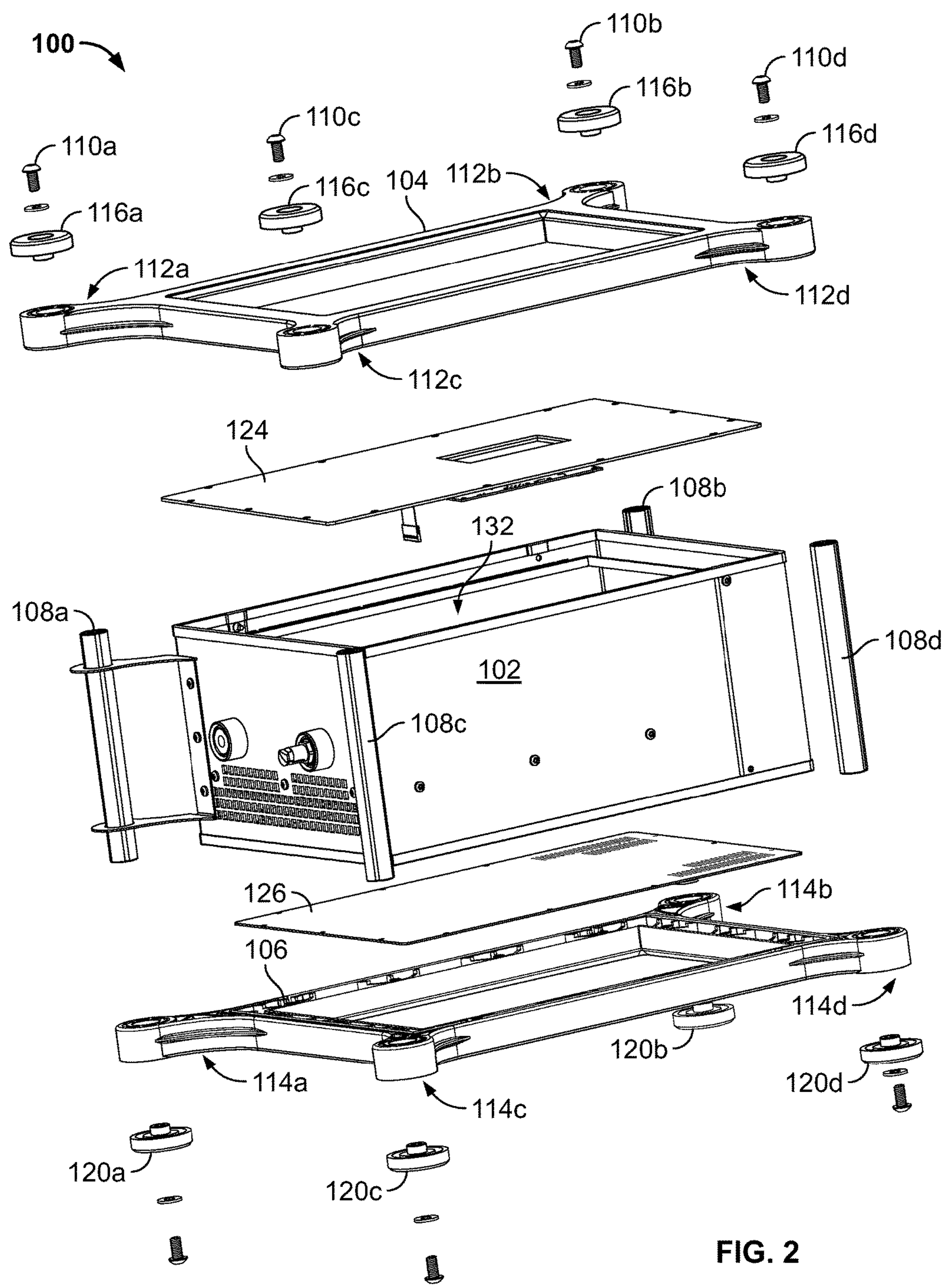
FIG. 2 is an exploded view of the example assembly and chassis of FIG. 1.

In some examples, assembly 100 includes strips of metal that are rigidly coupled between two or more of the member extensions 112*a*-112*d*, 114*a*-114*d*. The strips of metal may be included to provide additional rigidity when the assembly 100 is handled using the members 108*a*-108*d*. In the example of FIG. 2, the strip of metal (or other rigid material) is coupled to the chassis 102. In other examples, the first frame 104 and/or the second frame 106 have the strips of metal integrated into the first frame 104 and/or the second frame 106 to provide rigidity to the first frame 104 and/or the second frame 106. The strips of metal (or other rigid material) are rigidly coupled between ones of the first member extensions 112*a*, 112*b* and corresponding ones of the second member extensions 114*a*, 114*b*.

FIG. 2 is an exploded view of the example assembly 100 and chassis 102 of FIG. 1. As illustrated in FIG. 2, the assembly 100 further includes first member caps 116*a*-116*d* that fit within first openings 118*a*-118*d* of the first member extensions 112*a*-112*d* and second member caps 120*a*-120*d* that fit within second openings 122*a*-122*d* of the second member extensions 114*a*-114*d*. The members 108*a*-108*d* are attached between corresponding ones of the first member caps 116*a*-116*d* and/or the second member caps 120*a*-120*d*. The first member caps 116*a*-116*d* and the second member caps 120*a*-120*d* are constructed with metal to limit stress (e.g., from compression and/or shear forces) on the first member extensions 112*a*-112*d* and/or the second member extensions 114*a*-114*d* from attaching the members 108*a*-108*d*. The first frame 104, the second frame 106, the first member caps 116*a*-116*d*, and the second member caps 120*a*-120*d* provide spacing between the first frame 104 and the surface, between the second frame 106 and the surface, and/or between the chassis 102 and the surface, when the assembly 100 is resting on the surface and regardless of an orientation of the assembly 100 with respect to the surface. The first member extensions 112*a*-112*d* and the second member extensions 114*a*-114*d* are configured to project from the first frame 104 and the second frame 106*b* such that only the first member extensions 112*a*-112*d*, only the second member extensions 114*a*-114*d*, and/or ones of the first member extensions 112*a*-112*d* and/or the second member extensions 114*a*-114*d* contact the surface on which the assembly 100 is resting. In some examples, the features of the first member caps 116*a*-116*d* may be integrated with the corresponding first member extensions 112*a*-112*d*, and/or the features of the second member caps 120*a*-120*d* may be integrated with the corresponding second member extensions 114*a*-114*d*.

One or more of the fasteners 110*a*-110*d* are configured to attach the first frame 104 to the second frame 106 through a corresponding one or more of the members 108*a*-108*d*.

The first frame 104, when engaged against the chassis 102, holds a first panel 124 against the first side of the chassis 102 and provides a seal between the chassis 102 and the first panel 124. Additionally or alternatively, the second frame 106, when engaged against the chassis 102, holds a second panel 126 against the second side of the chassis 102 and provides a seal between the chassis 102 and the second panel 126. The first panel 124 and/or the second panel 126 may also seal against the chassis 102.

The first frame 104, the second frame 106, the members 108*a*-108*d*, the first panel 124, the second panel 126, and the chassis 102 are configured to be assembled in a top-down assembly method. For example, the assembly 100 may be assembled starting with components on a first end (e.g., the second frame 106 and caps 120*a*-120*d* and ending with the first frame 104, the caps 116*a*-116*d*, and/or the fasteners 110*a*-110*d*.

In the example of FIGS. 1 and 2, the members 108*a*-108*d* are tubular (e.g., have circular cross-sections). Alternatively, one or more of the members 108*a*-108*d* have an asymmetric cross-section (e.g., a D-shaped cross section, any other asymmetric shape) to prevent rotation of the members 108*a*-108*d* when attached between the first frame 104 and the second frame 106. The first frame extensions 112*a*-112*d* and/or the second frame extensions 114*a*-114*d* may have complementary symmetrical or asymmetrical feature to permit or prevent rotation of the members 108*a*-108*d*.

The first frame 104 and/or the second frame 106 are constructed using metal (e.g., die cast metal, cast aluminum, forged aluminum, etc.) and/or molded plastic. In some examples, the first frame 104 and/or the second frame 106 include screw bosses to enable attachment of one or more accessories to the first frame 104 and/or the second frame 106. The first frame 104 and/or the second frame 106 are only engaged to the chassis 102 via attachment of the members 108*a*-108*d* between the first frame 104 and the second frame 106. That is, the first frame 104 and/or the second frame 106 may not be secured or attached to the chassis 102 any other fasteners other than the fasteners 110*a*-110*d* connecting the first frame 104 and/or the second frame 106 to the members 108*a*-108*d* and/or through the members 108*a*-108*d*. For example, the first frame 104 and the second frame 106 are engaged to the chassis 102 by tightening the first frame 104 and the second frame 106 to the members 108*a*-108*d* with at least a threshold torque. In other examples, one or more additional fasteners may be used to attach or secure the first frame 104 and/or the second frame 106 to the chassis 102.

As shown in FIG. 2, the first frame 104 and/or the second frame 106 are configured to secure the panels 124, 126, which are portions of the chassis 102, onto the chassis 102 when the first frame 104 and/or the second frame 106 are secured by the members 108*a*-108*d* and the fasteners 110*a*-110*d*. An example implementation of the first frame 104 is described below with reference to FIGS. 11A and 11B. In some other examples, the first frame 104 and/or the second frame 106 are a solid panels that cover a side of the chassis 102 when the first frame 104 is secured against the chassis 102. In such examples, the panel 124 may be integral to the first frame 104 and/or the second panel 126 is integral to the bottom panel 126.

Figure 3:
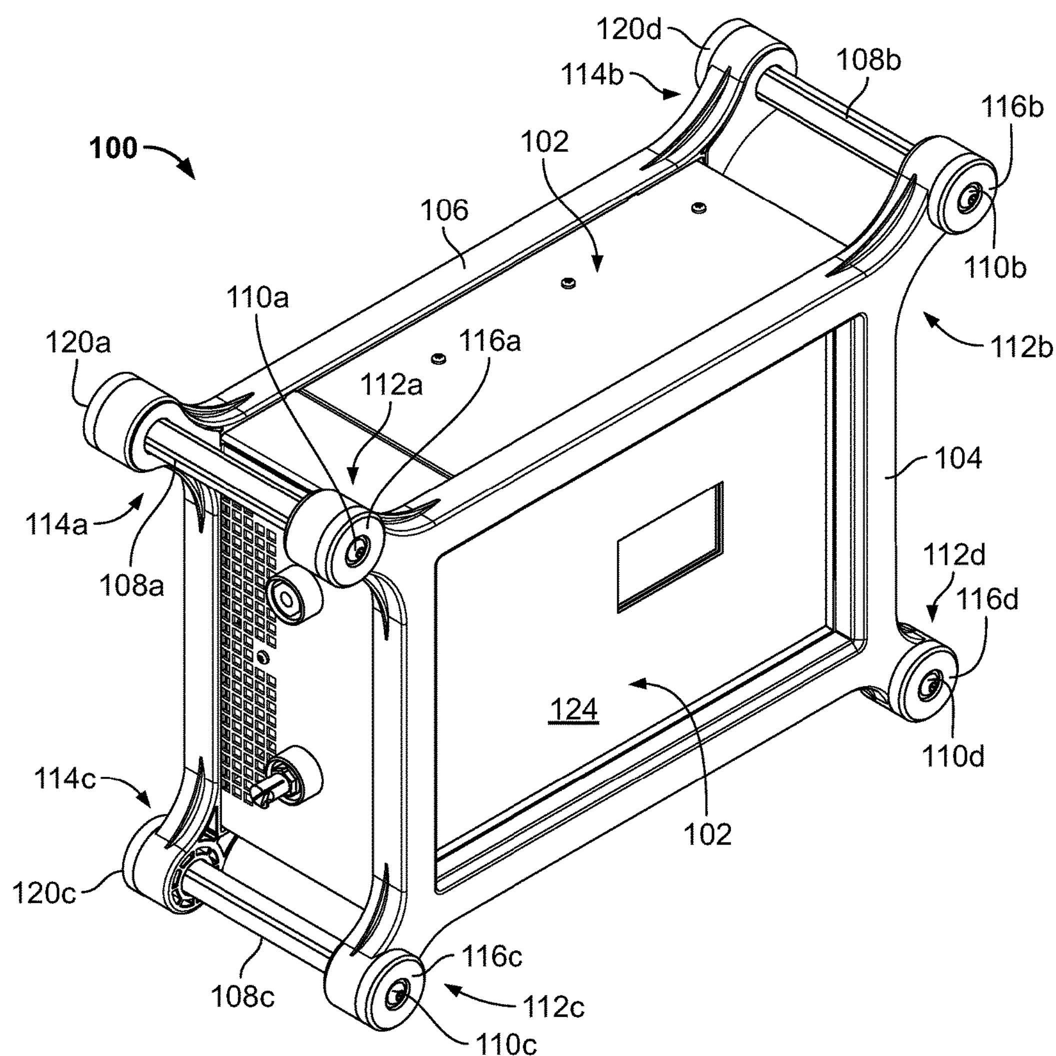
FIG. 3 is another view of the example assembly and chassis of FIG. 1.
Figures 4, 5:
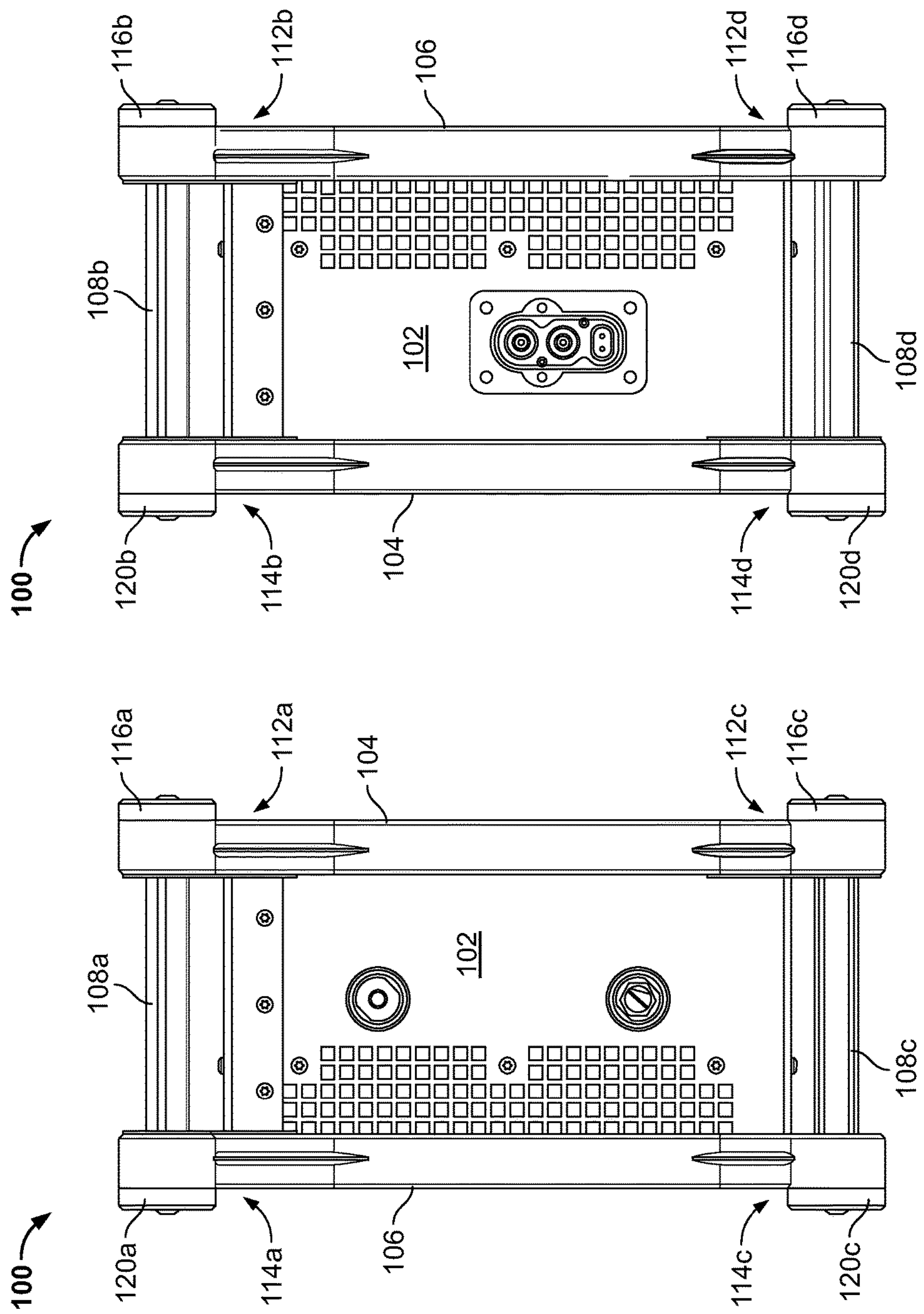
FIGS. 4-9 illustrate plan views of the example assembly and chassis of FIG. 1.
Figures 6, 7:
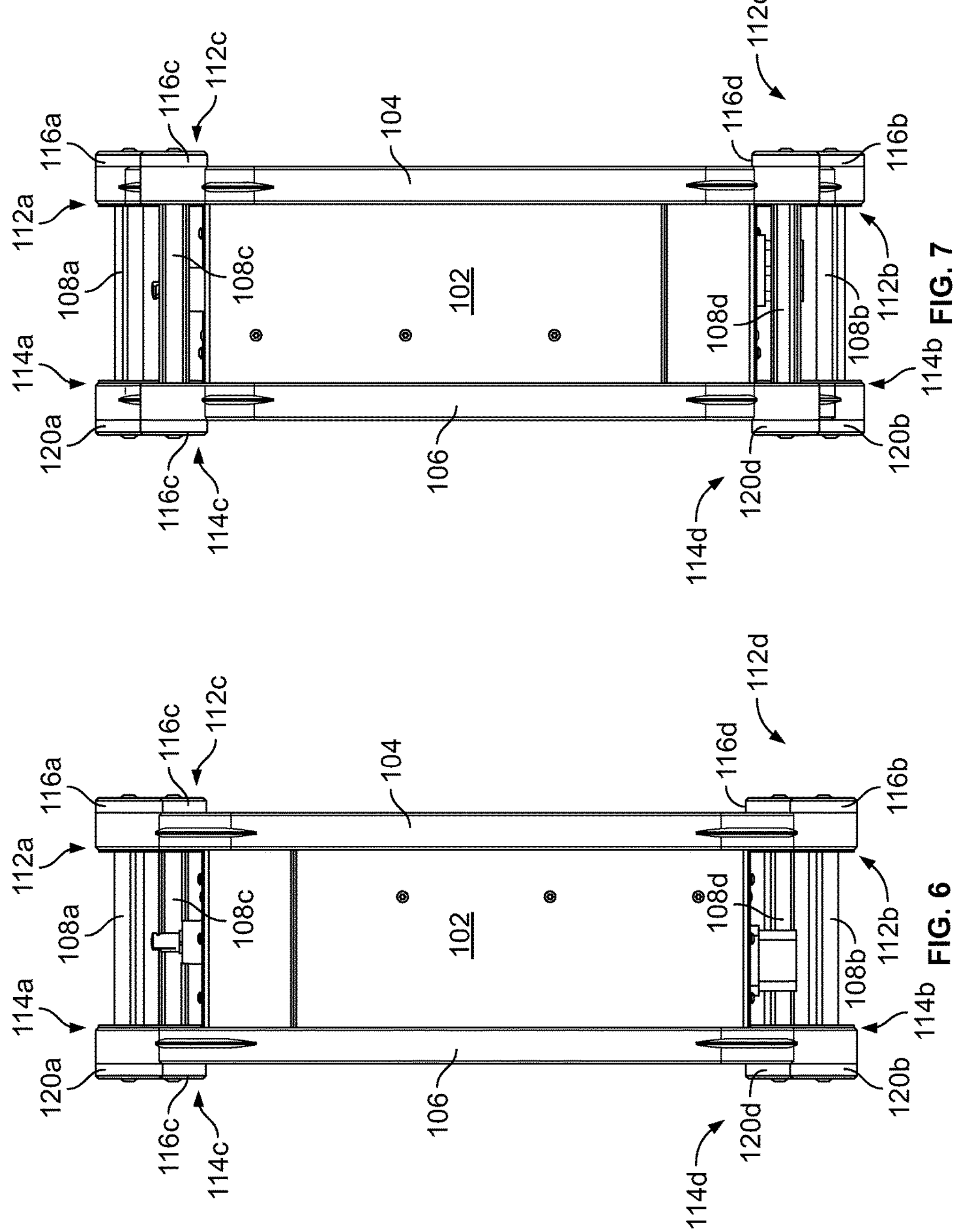
Figure 8:
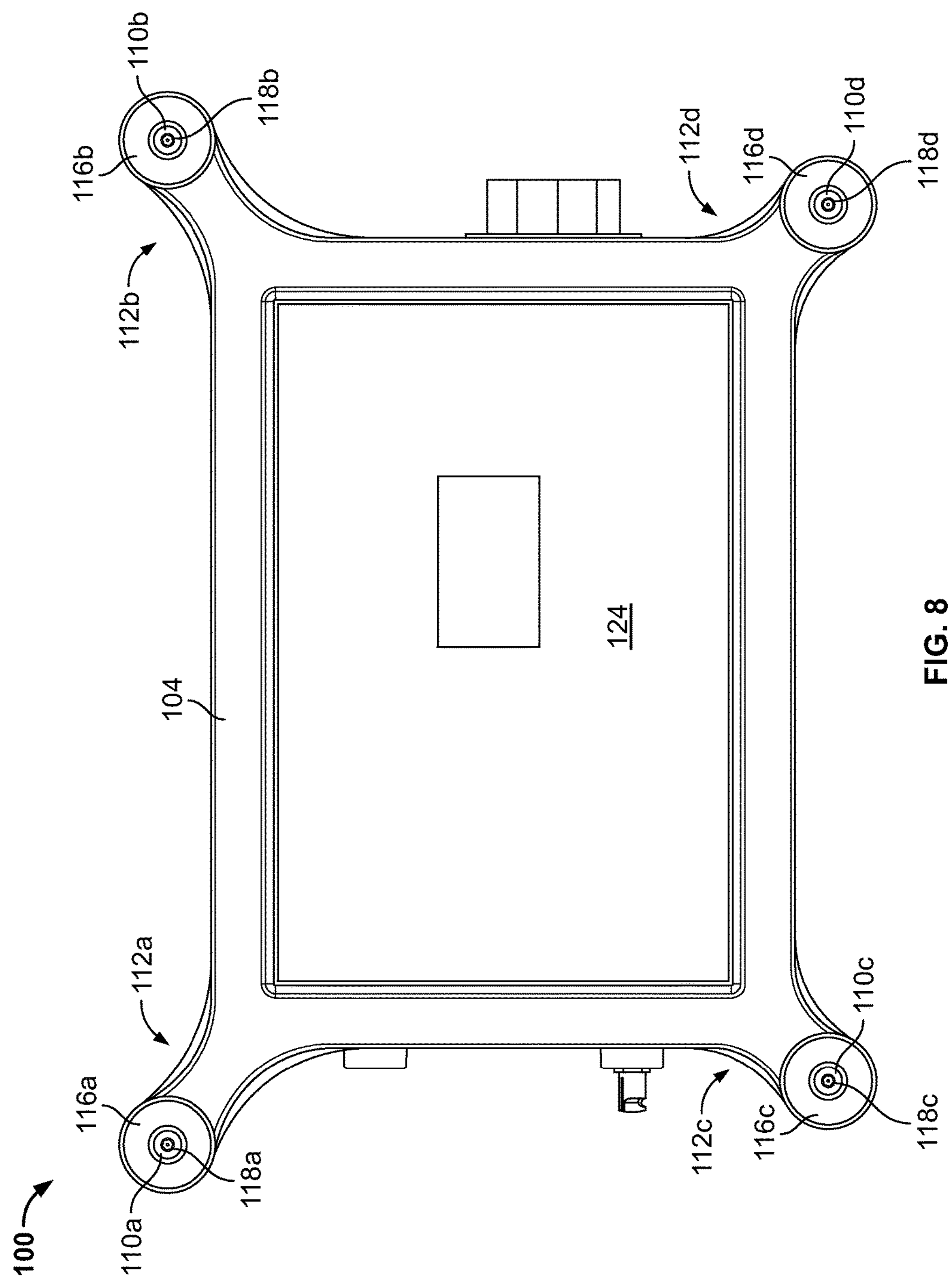
Figure 9:
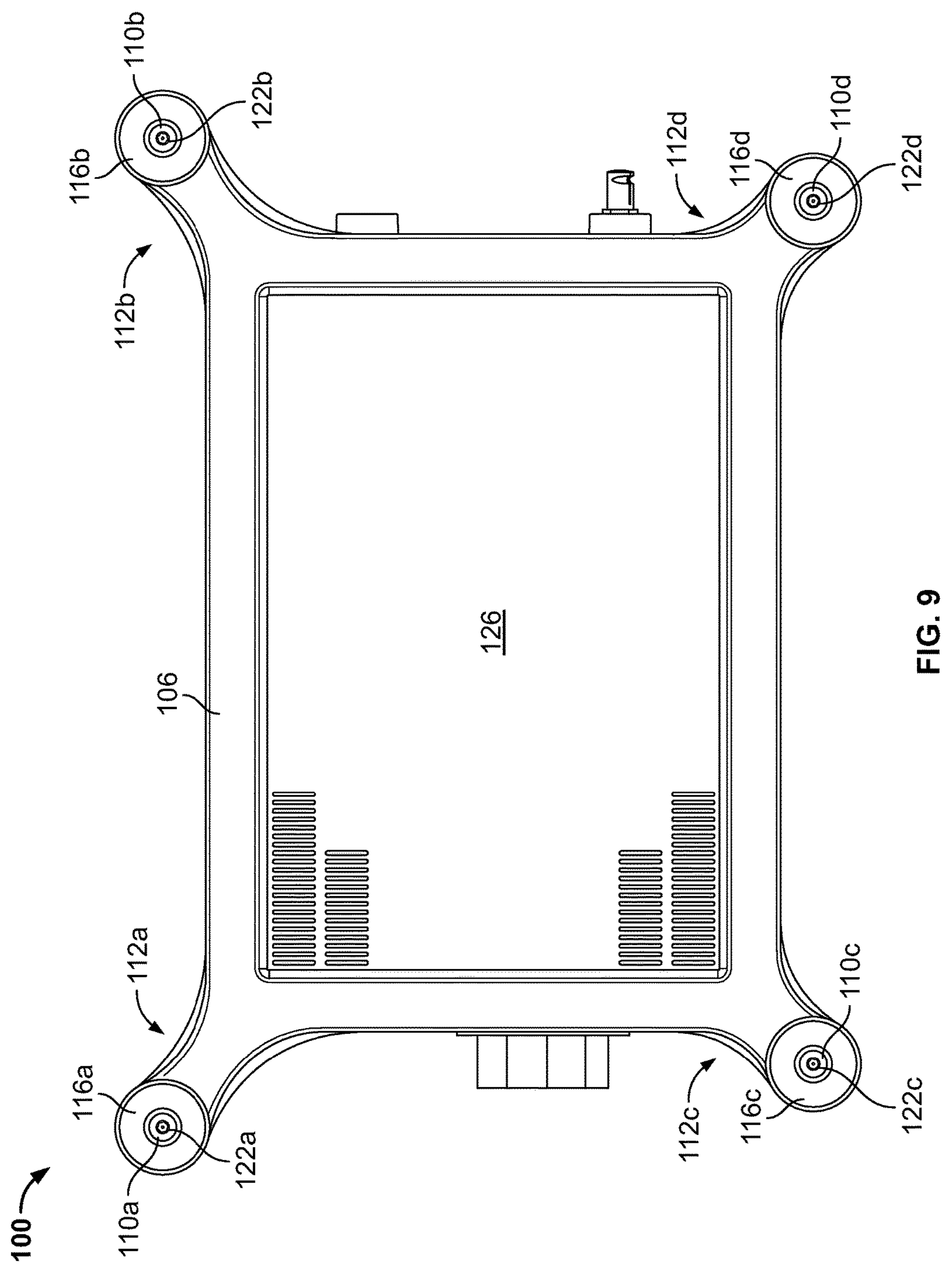

FIG. 3 is another view of the example assembly 100 and chassis 102 of FIG. 1. FIGS. 4-9 illustrate plan views of the example assembly 100 and chassis 102 of FIG. 1.

Figure 10:
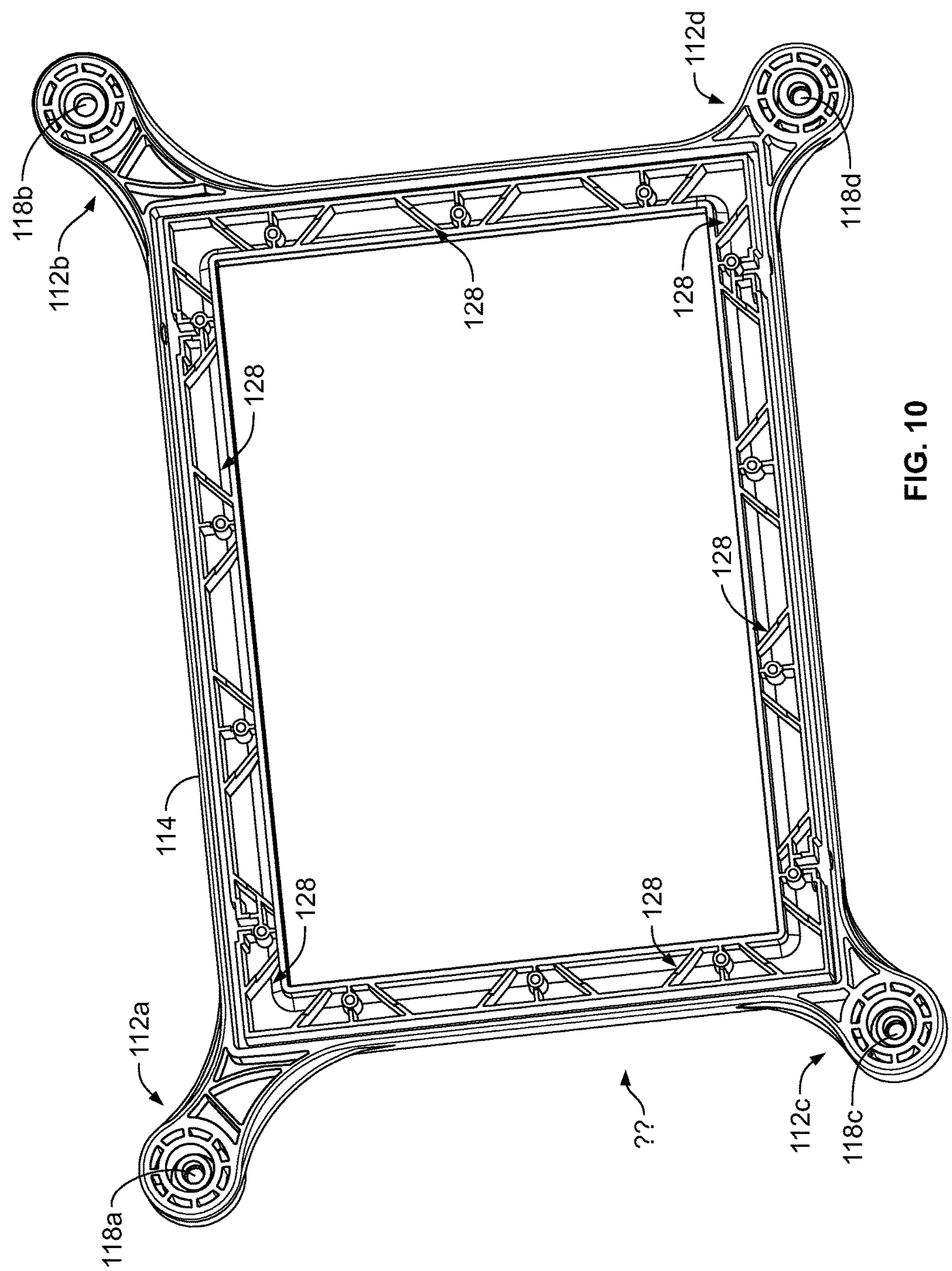
FIG. 10 is a section view of one of the frames of the example assembly and chassis of FIG. 1.
Figure 11A:
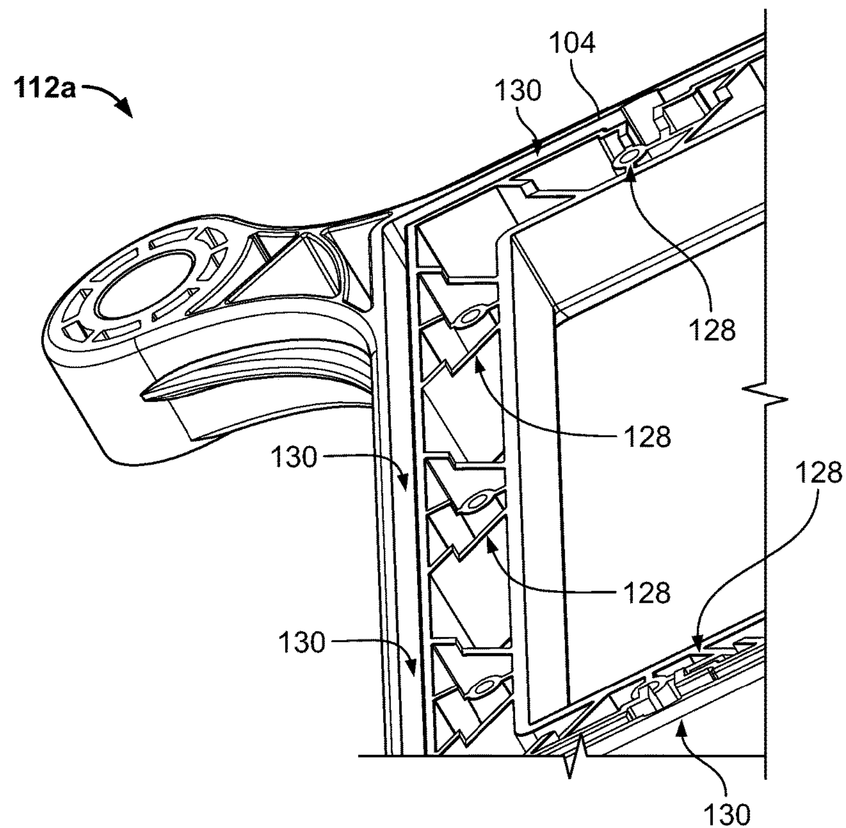
FIGS. 11A and 11B illustrate more detailed views of the example frame of FIG. 1.
Figure 11B:
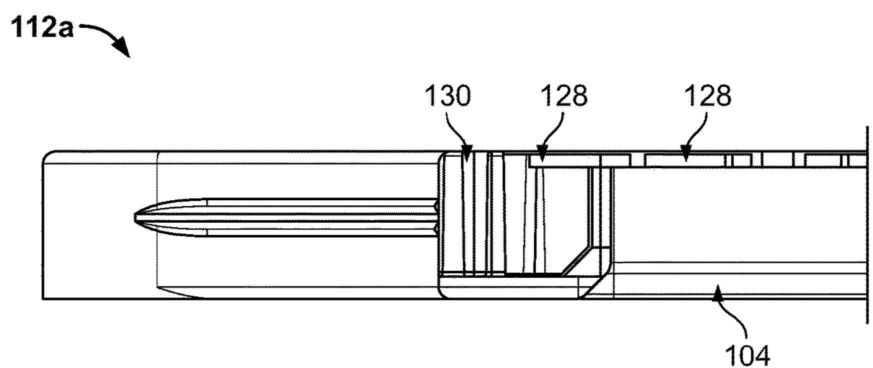
Figure 12:
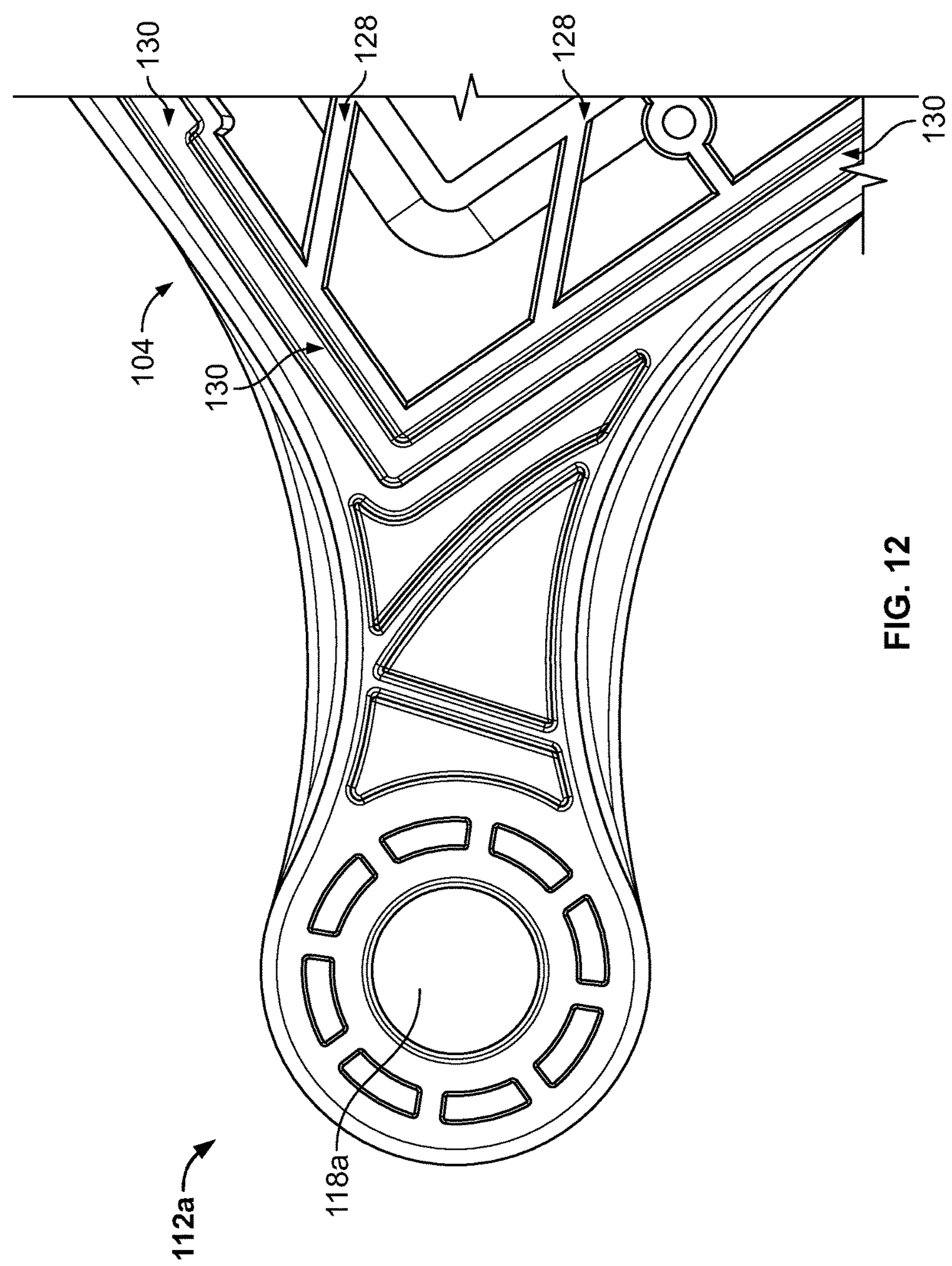
FIG. 12 is a more detailed view of one of the example member extensions of FIG. 1.

FIG. 10 is another view of one of the frames of the example assembly and chassis of FIG. 1. The first frame 104 and the second frame 106 seal an interior chamber 132 of the chassis 102 from an exterior environment. FIG. 11A is a more detailed perspective view of an inner portion of the first frame 104 of FIG. 10. FIG. 11B illustrates a section view of the example first frame 104. FIG. 12 is a more detailed view of one of the example member extensions 112*a* of FIG. 1.

The first frame 104 includes a shoulder 128 to hold the first panel 124 and a groove 130 to mate with the chassis 102. In some examples, the assembly includes gasket in the shoulder 128 of the first frame 104 between the first panel 124 and the first frame 104. The gasket provides a seal between the first panel 124 and the first frame 104 when the members 108*a*-108*d* are tightened between the first frame 104 and the second frame 106. Additionally or alternatively, there may be a gasket in the groove 130 to provide a seal between the first frame 104 and the chassis 102 when the members 108*a*-108*d* are tightened between the first frame 104 and the second frame 106. In some examples, the gasket on the shoulder 128 and the gasket in the groove 130 cooperate to seal the chassis 102 (e.g., to form an enclosure) when the members 108*a*-108*d* are tightened between the first frame 104 and the second frame 106.

In some examples, one or more of the members 108*a*-108*d* functions as or includes an axle, and the assembly 100 includes a wheel mounted to the axle. The wheel and axle may improve the portability and/or ease of handling of the assembly 100.

Figure 13:
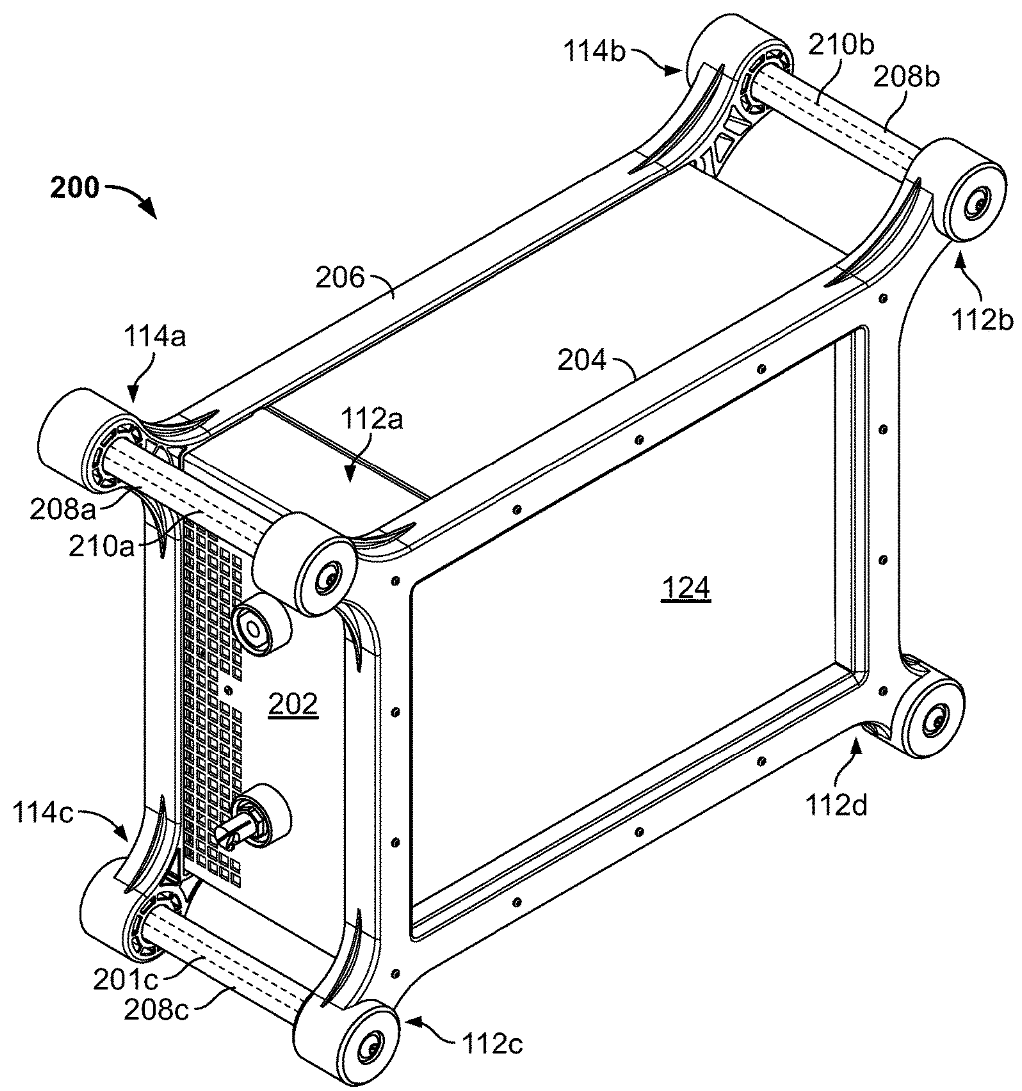
FIG. 13 is a perspective view of another example assembly for a chassis containing electronic components, in accordance with aspects of this disclosure.
Figure 14:
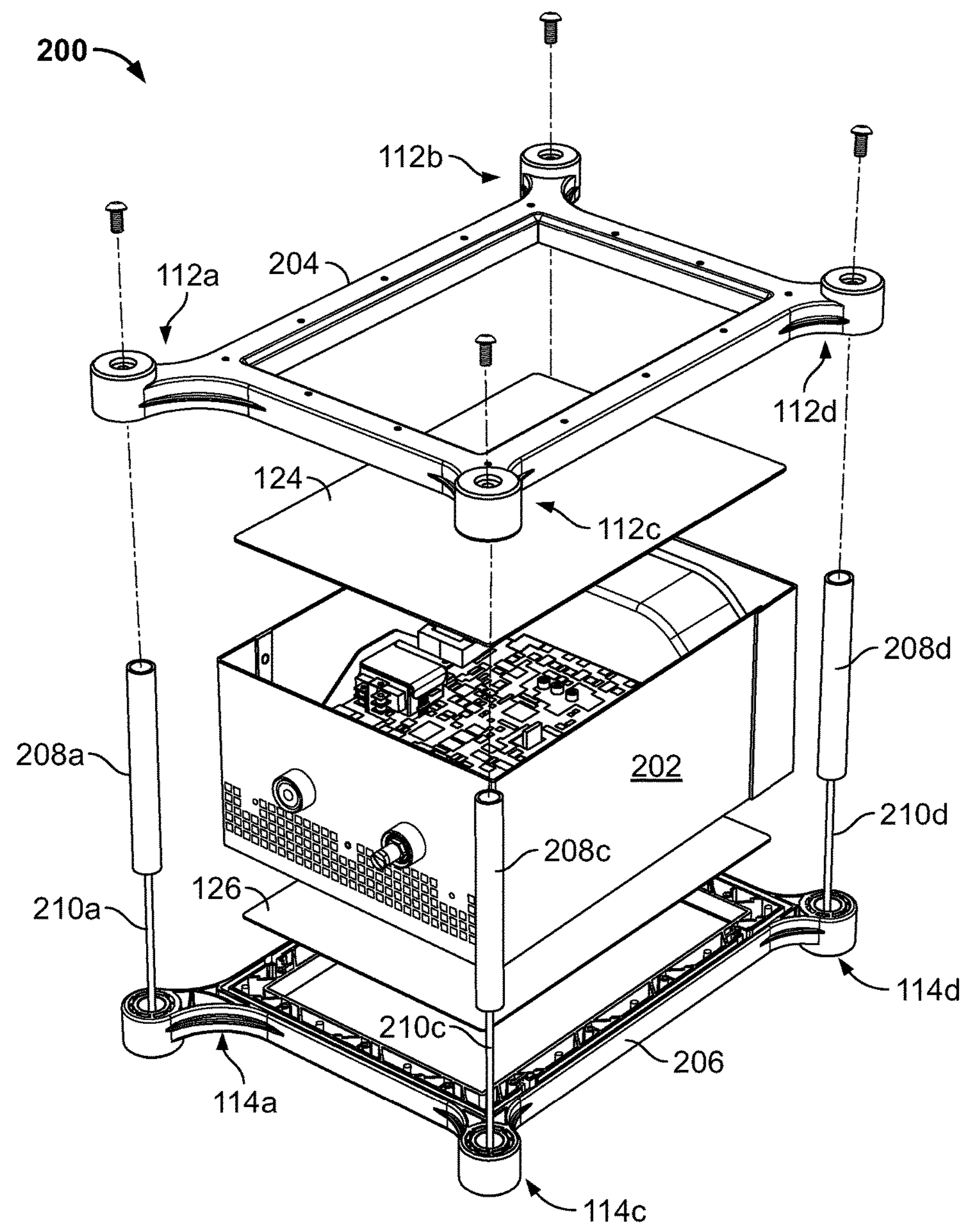
FIG. 14 is an exploded view of the example assembly and chassis of FIG. 13.

FIG. 13 is a perspective view of another example assembly 200 for a chassis 202 containing electronic components. FIG. 14 is an exploded view of the example assembly 200 and chassis 202 of FIG. 13. The assembly 200 is similar to the assembly 100 of FIGS. 1-12, but does not include the end caps on the member extensions of the frames 204, 206 of the assembly 200. Additionally, fasteners 210*a*-210*d* in the example of FIGS. 13 and 14 extend through the length of the members 208*a*-208*d*. The example assembly 200 may be quickly disassembled by removing the fasteners 210*a*-210*d* from the threaded rods or screws.

Figure 15:
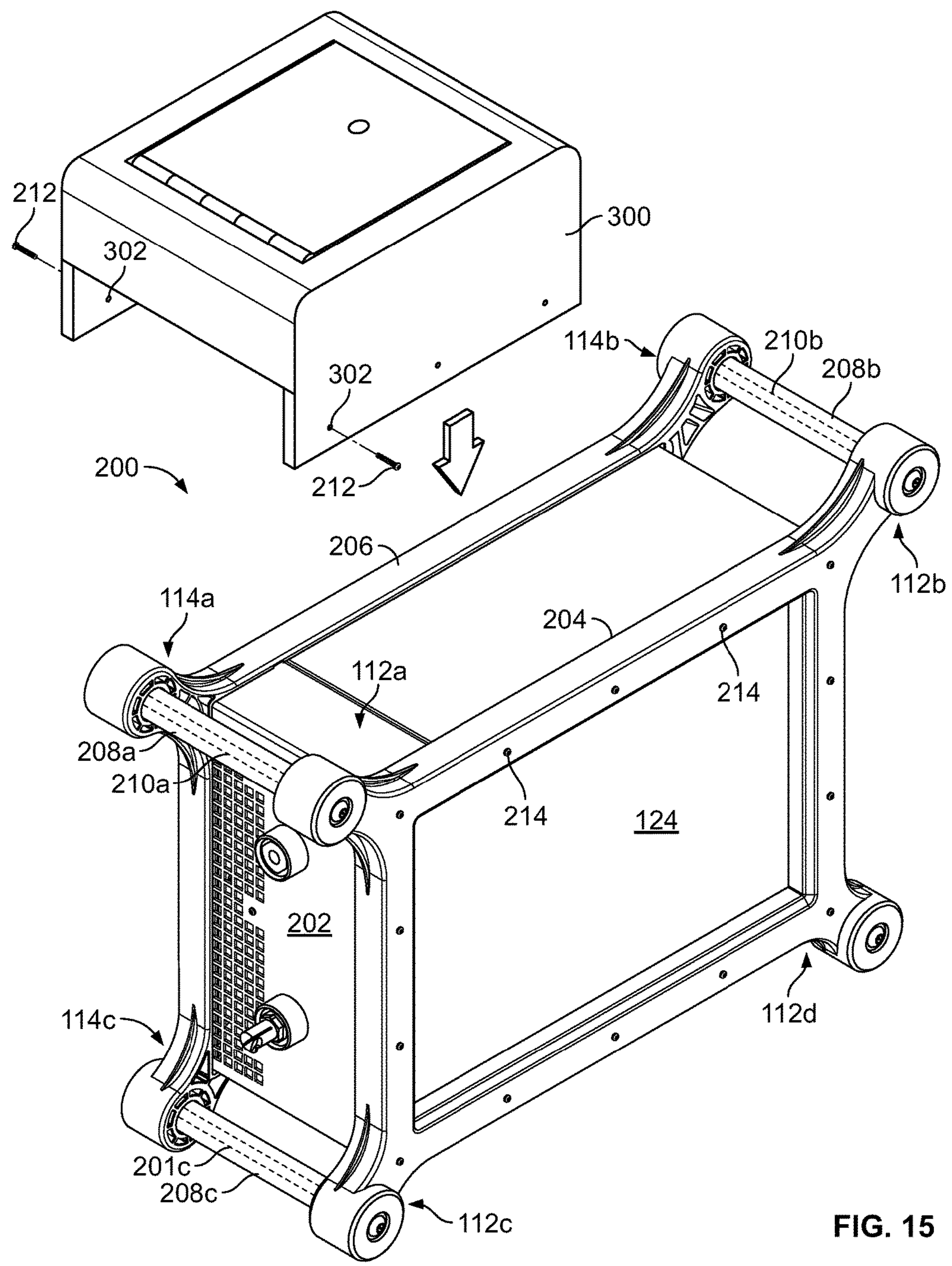
FIG. 15 illustrates an example of an accessory being attached to one of the example assemblies.

FIG. 15 illustrates an example of an accessory 300 being attached to the assembly 200. In the example of FIG. 15, screws 212 are used to securely attach the accessory 300 to screw bosses 214 on the frames 204, 206. The accessory 300 has holes 302 which align with the screw bosses 214.

While example dimensions are illustrated in the figures, other relative dimensions, including length, height, and/or depth, may be included. Tooling used to construct the frames can be modular to accommodate frames and/or enclosures of various sizes.

As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations.

While the present method and/or system has been described with reference to certain implementations, it will be understood by those skilled in the art that various changes may be made and equivalents may be substituted without departing from the scope of the present method and/or system. In addition, many modifications may be made to adapt a particular situation or material to the teachings of the present disclosure without departing from its scope. For example, systems, blocks, and/or other components of disclosed examples may be combined, divided, re-arranged, and/or otherwise modified. Therefore, the present method and/or system are not limited to the particular implementations disclosed. Instead, the present method and/or system will include all implementations falling within the scope of the appended claims, both literally and under the doctrine of equivalents.

What is claimed is:

1. An apparatus, comprising:

a chassis configured to hold one or more electronic systems;

a first frame configured to engage a first side of the chassis;

a second frame configured to engage a second side of the chassis opposite the first side; and members attached between the first frame and the second frame using fasteners, the members extending between the first frame and the second frame to rigidly secure the first frame and the second frame against the chassis to create an enclosure comprising the first frame, the second frame, and the chassis, the members being exterior to the chassis, wherein the first frame comprises a shoulder to hold a first panel and a groove to mate with the chassis.

2. The apparatus as defined in claim 1, wherein the first frame comprises first member extensions projecting outward from the chassis, the second frame comprises second member extensions projecting outward from the chassis opposite the first member extensions, and the members are detachably attached between the first member extensions and the second member extensions.

3. The apparatus as defined in claim 2, further comprising:

first member caps configured to fit within openings of the first member extensions; and second member caps configured to fit within openings of the second member extensions, the members configured to be attached between the first member caps and the second member caps.

4. The apparatus as defined in claim 3, wherein the first member caps and the second member caps comprise metal and are configured to limit stress on the first member extensions and the second member extensions from attaching the members.

5. The apparatus as defined in claim 3, wherein the first frame, the second frame, the first member caps, and the second member caps are configured to, when the apparatus is resting on a surface, provide spacing between the first frame and the surface and between the second frame and the surface regardless of an orientation of the apparatus with respect to the surface.

6. The apparatus as defined in claim 2, wherein the first member extensions and the second member extensions are configured to project from the first frame and the second frame such that only the first member extensions, only the second member extensions, or ones of the first member extensions and the second member extensions contact a surface on which the apparatus is resting.

7. The apparatus as defined in claim 1, wherein the first frame is configured to, when engaged against the chassis, hold the first panel against the first side of the chassis and provide a seal between the chassis and the first panel.

8. The apparatus as defined in claim 1, further comprising:

a first gasket in the shoulder of the first frame between the first panel and the first frame, the first gasket to provide a first seal between the first panel and the first frame when the members are tightened between the first frame and the second frame.

9. The apparatus as defined in claim 8, further comprising a second gasket in the groove to provide a seal between the first frame and the chassis when the members are tightened between the first frame and the second frame, the first gasket and the second gasket to cooperate to seal the chassis when the members are tightened between the first frame and the second frame.

10. The apparatus as defined in claim 1, wherein the first frame and the second frame comprise metal or plastic.

11. The apparatus as defined in claim 1, wherein the first frame comprises screw bosses to enable attachment of an accessory to the first frame.

12. The apparatus as defined in claim 1, wherein the first frame and the second frame are only engaged to the chassis via attachment of the members between the first frame and the second frame.

13. The apparatus as defined in claim 12, wherein the first frame and the second frame are engaged to the chassis by tightening the first frame and the second frame to the members with at least a threshold torque.

14. The apparatus as defined in claim 1, wherein the chassis comprises at least one of a welding-type power supply, a wire feeder, an inductive heating power supply, a plasma cutter, a space heater, or a work radio.

15. The apparatus as defined in claim 1, wherein the first frame and the second frame are to seal an interior chamber of the chassis from an exterior environment.

16. The apparatus as defined in claim 1, wherein the members have an asymmetric cross-section to prevent rotation of the members when attached between the first frame and the second frame.

17. The apparatus as defined in claim 1, wherein the second frame is a solid panel configured to cover a side of the chassis when the first frame is secured against the chassis.

18. An apparatus, comprising:

a chassis configured to hold one or more electronic systems;

a first frame configured to engage a first side of the chassis and to hold a first panel against the first side of the chassis;

a second frame configured to engage a second side of the chassis opposite the first side;

members attached between the first frame and the second frame using fasteners, the members extending between the first frame and the second frame to rigidly secure the first frame and the second frame against the chassis to create an enclosure comprising the first frame, the second frame, and the chassis, the members being exterior to the chassis, wherein at least one of the members comprises an axle; and a wheel mounted to the axle.

* * * * *